United States Patent [19]

Vranken

[11] 4,313,151

[45] Jan. 26, 1982

[54] FLAT ELECTRIC COIL WITH TAP

[75] Inventor: Roger A. Vranken, Eindhoven, Netherlands

[73] Assignee: U.S. Philips Corporation, New York, N.Y.

[21] Appl. No.: 105,691

[22] Filed: Dec. 20, 1979

[30] Foreign Application Priority Data

Jan. 12, 1979 [NL] Netherlands ........................ 7900245

[51] Int. Cl.$^3$ .......................... H05K 1/16; H01F 5/00

[52] U.S. Cl. .................................... 361/402; 336/200; 336/232

[58] Field of Search ................. 336/223, 200, 232, 69, 336/70; 361/268, 270, 402; 29/602 R, 605

[56] References Cited

U.S. PATENT DOCUMENTS 3,731,005 5/1973 Shearman ........................ 336/200 X 3,785,046 1/1974 Jennings .......................... 336/200 X 4,080,585 3/1978 Molthan .............................. 336/200

FOREIGN PATENT DOCUMENTS 1580316 9/1969 France ................................ 336/200

OTHER PUBLICATIONS

Altmann et al., IBM Technical Disclosure Bulletin, Printed Delay Line, vol. 8, No. 5, Oct. 1965, pp. 741–742.

*Primary Examiner*—Thomas J. Kozma

*Attorney, Agent, or Firm*—William J. Streeter; Bernard Franzblau

[57] ABSTRACT

A miniaturized electric coil having a center tap which is constructed from a spiral-like bottom conductor pattern provided on a substrate, an insulating intermediate layer and a spiral-like top conductor pattern which is connected to the bottom conductor pattern via windows in the intermediate layer. A conductor path which is situated in the top conductor pattern is led out from the interior of the top conductor pattern to form the tap. At the area of said conductor path the conductors of the top conductor pattern are locally interrupted but are interconnected by means of said windows and connection conductors in the bottom conductor pattern that are connected parallel to the interruptions so as to ensure an undisturbed current flow in the top conductor pattern.

10 Claims, 4 Drawing Figures

FLAT ELECTRIC COIL WITH TAP

The invention relates to a flat multi-layer electric coil having a tap and comprising a stack composed of a number of conductor layers each comprising a system of spiral-like electrically conductive tracks, in which adjacent conductor layers are separated from each other by an electrically insulating layer, and in which adjacent conductor layers are interconnected electrically via windows in the electrically insulating layer.

Flat multi-layer electric coils having a (centre) tap are disclosed in French Patent Specification 1,580,316. In order to provide these known coils, which can be manufactured by means of thick and/or thin film methods, with a (centre) tap situated on the outside, they are constructed from at least four interconnected conductor layers having multiple spirals which alternately spiral from the outside to the inside and from the inside to the outside. Each conductor layer is provided on a separate substrate. Such a multi-layer coil has the advantage over likewise known mono-layer coils having a (centre) tap that both the end connections and the (centre) tap are located on the outside so that no bridging wires are necessary to produce a connection with the interior of the coil. Said coil has the further advantage that the inductance per surface unit is considerably larger. A disadvantage, however, is that it cannot be provided on a substrate for a flat film circuit with the same process steps with which capacitors and/or crossing electric leads are provided on such a substrate. In the manufacture of thick-film capacitors and crossing electric leads first a first conductor layer is silk-screened on the substrate, then a dielectric layer and then a second conductor layer.

It is therefore the object of the invention to provide a flat multi-layer electric coil which is provided with a (centre) tap and which, while maintaining the connections on the outside, has only two conductor layers which are separated by an electrically insulating (dielectric) layer.

For that purpose, a coil of the kind mentioned in the opening paragraph is characterized according to the invention in that it comprises a substrate which carries a stack of two conductor layers, in which the first conductor layer has a system of single spiral-like electric conductor tracks together constituting a multiple first spiral having an outer end and an inner end and a given sense of rotation, in which the second conductor layer has a system of single electric conductor tracks together forming a second spiral having an inner end and an outer end and a sense of rotation equal to that of the first spiral, the single conductor tracks of the second spiral being interrupted in places which are situated on one line, in which places the ends of the conductor tracks are interconnected on either side of the interruptions via windows in the insulating layer and connection conductors in the first conductor layer, and in which the inner ends of the first and second spirals are interconnected and the inner end of the second spiral is led out by means of a conductor which extends between the interruptions of the second spiral so as to form a tap.

The result of the above-described construction is that only two conductor layers suffice, since a connection to the centre of the coil is produced which in the second conductor layer is led out between the interruptions of the second spiral.

According to a further aspect of the invention the above-described coil is characterized in that at least on the outside of the coil the perpendicular projections of the conductor tracks of the second conductor layer are situated on the first conductor layer between the conductor tracks of the first conductor layer. In this manner it is achieved that the self-capacitance of the coil is as small as possible.

The invention further provides an electric miniaturized circuit having a flat substrate which carries at least a coil having a centre tap, a capacitor and/or a set of crossing conductor paths, in which the elements of the circuit are formed from a bottom conductor layer, a dielectric intermediate layer and a top conductor layer. The design of the coil having a centre tap according to the invention makes it possible to provide the various discrete elements of the circuit via the same thick film method (silk screening) steps.

An embodiment of the electric miniaturized circuit according to the invention is characterized in that the bottom conductor layer comprises a system of single, spiral-like conductor tracks together forming a multiple spiral having an outer end and an inner end and a given sense of rotation, that the top conductor layer comprises a system of single spiral-like electric conductor tracks together constituting a second spiral having an inner end and an outer end and a sense of rotation equal to that of the first spiral, the conductor tracks of the second spiral being interrupted in places which are situated on one line, in which places the ends of the conductor tracks are interconnected on either side of the interruptions via windows in the dielectric intermediate layer and connection conductors in the first conductor layer, and in which the inner ends of the first and the second spiral are interconnected and the inner end of the second spiral is led out to form a tap by means of a conductor path which extends between the interruptions.

The invention will now be described in greater detail, by way of example, with reference to the drawing in which.

Two-layer coils according to the invention are manufactured by means of the same method as capacitors or crossing conductor paths. If crossing conductor paths and/or capacitors already occur on the substrate for the circuit to be made, this has the advantage that coils can be made without extra thick-film processing costs.

Figure 1:
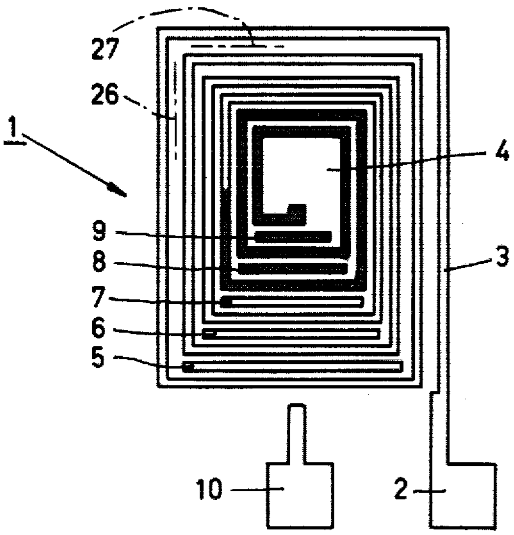
FIG. 1 is a plan view of a bottom conductor layer pattern for a coil according to the invention.

A conductor paste (for example, a paste made by Dupont having the indication Dupont 9770) is provided in a desired pattern on an electrically insulating substrate (which may be, for example, of aluminium oxide) by means of a first silk screen. This print is used, for example, to form lower conductor paths for crossing conductors, connection pads for resistors, bottom conductor pads for capacitors and bottom conductor layers for coils. FIG. 1 shows the pattern 1 for a bottom conductor layer for a two-layer coil according to the invention. The pattern 1 comprises a connection pad 2 which is connected to a multiple spiral 3 which spirals counterclockwise from the outside to the inside. Separate path sections 5, 6, 7, 8 and 9 are situated successively proceeding farther towards the interior 4 of the coil to be made. A second contact pad 10 is also present. The paste is dried and sintered at a temperature of approximately 850° C. After sintering, the thickness of the spirals is approximately 12 μm with a width of approximately 300 μm.

Figure 2:
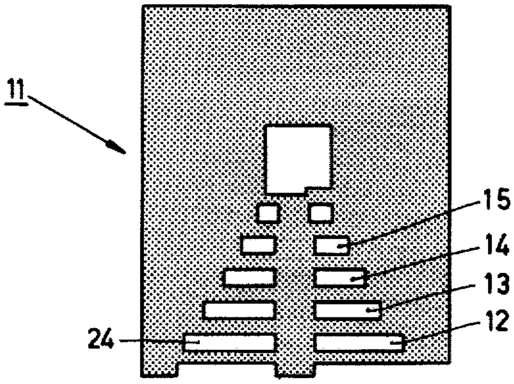
FIG. 2 is a plan view of an insulating layer pattern for a coil according to the invention.

A dielectric paste (for example a paste made by Dupont having the indication Dupont 910) is provided over the bottom conductor layer by means of a second silk screen. This print serves as an insulating layer for capacitors, crossing conductor paths and coils. FIG. 2 shows the pattern 11 for an insulation layer for a two-layer coil according to the invention. The pattern defines a number of windows 12, 13, 14, 15 and so on, through which the bottom conductor layer (FIG. 1) is electrically connected to a top conductor layer (FIG. 3) in a subsequent step. This paste is also dried and sintered at a temperature of 850° C. After sintering, the thickness of the insulating layer is approximately 40 μm. It is often to be preferred to provide the insulating layer in two steps so as to restrict the occurrence of continuous holes in the layer.

Figure 3:
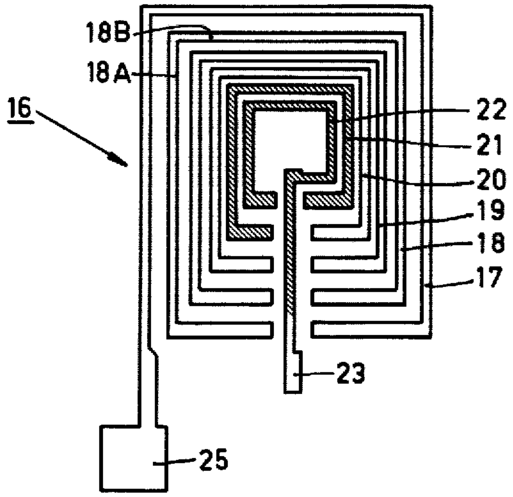
FIG. 3 is a plan view of a top conductor layer pattern for a coil according to the invention.

A second conductor paste is provided on the insulating layer (for example again a paste made by Dupont having the indication Dupont 9770) by means of a third silk screen. This print is used to form top conductor pads for capacitors, upper conductor paths for crossing conductors and top conductor layers for coils. FIG. 3 shows the pattern for a top conductor layer for a two-layer coil according to the invention. The pattern comprises, proceeding from the outside to the inside, a first single spiral 17, a second spiral 18, a third spiral 19, a fourth spiral 20, a fifth spiral 21 and a sixth spiral 22. Spiral 22 is connected to a conductor track 23 which is led out. This paste is also dried and sintered at a temperature of approximately 850° C. As was the case with the bottom conductor layer, the thickness of the spirals after sintering is approximately 12 μm with a width of approximately 300 μm.

By stacking the patterns shown in FIGS. 1, 2 and 3, the first single spiral 17 of the top conductor layer is connected, via window 12 in the insulating layer, to the separate path section 5 in the bottom conductor layer which in turn is connected, via a window 24 in the insulating layer, to the second single spiral 18 of the top conductor layer. The second spiral 18 of the top conductor layer in turn is connected, via window 13 and path section 6, to the third spiral 19 of the top conductor layer, and so on. Finally, the conductor path 23 of the top conductor layer is connected to the connection pad 10 of the bottom conductor layer to form a tap.

Figure 4:
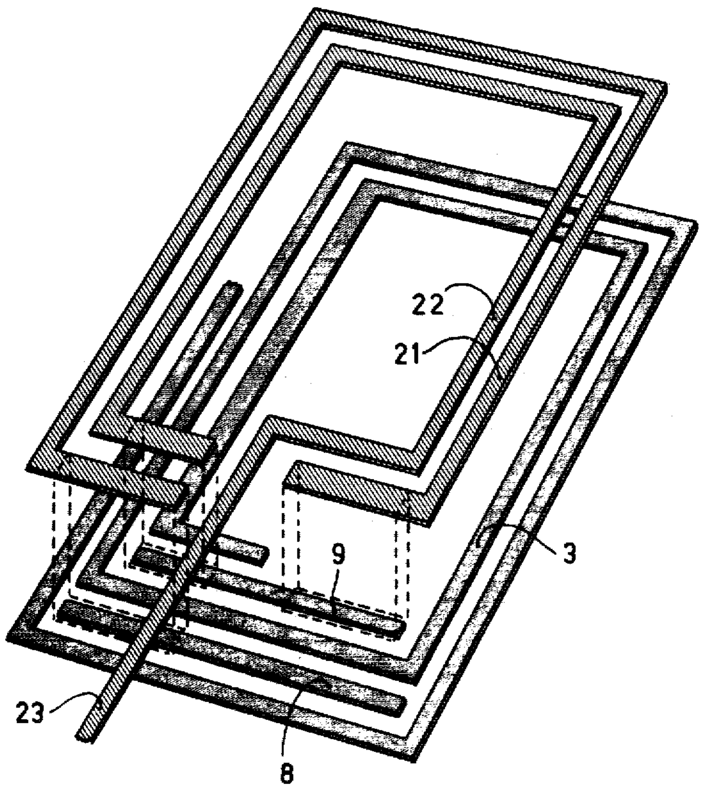
FIG. 4 is a perspective view of the central part of a coil in which the conductor layers of FIGS. 1 and 3 and the insulation layer of FIG. 2 have been used.

FIG. 4, in which the same reference numerals are used for the same components as in FIGS. 1, 2 and 3, shows for further explanation a perspective view of a two-layer coil manufactured in the above-described manner in which the distance between the two conductor layers is greatly exaggerated.

A moisture-tight screening layer may be provided over the top conductor layer (for example, an epoxy material of ESL having the indication 240 SB).

A two-layer coil manufactured in the above-described manner and having an area of 102 $mm^2$ showed the following properties:

Inductance: 0.84 μH
self-capacitance: 1.41 pF
self-resonance: 68 MHz

Q-factor at 40 MHz: 32
coupling between the two coil halves: K=0.82.

In order to obtain a coil having a self-capacitance which is as low as possible, it is of importance that notably on the outside of the coil the spiral turns of the top conductor layer and those of the bottom conductor layer should not be situated straight above one another but should be shifted relative to each other. The patterns are therefore preferably designed and positioned so that, for example, part 18A of path 18 of the top conductor pattern is situated straight above the intermediate space 26 between the first and the second turn of spiral 3 of the bottom conductor layer, part 18B is situated straight above intermediate space 27 and so on. It is favourable when the intermediate space between the turns increases from the inside to the outside.

In the more inwardly situated part of the coil it is of less importance that the conductor tracks of the spirals should not be situated straight above each other because the capacitance there is only over a small part of the coil. In order to save space, the conductor tracks of the spirals on the inside of the coil may hence be situated above each other without this adversely influencing the self-capacitance of the coil too much A coil having the configuration shown in the figures had a self-capacitance of 6.5 pF.

What is claimed is:

1. A flat multi-layer electric coil having a tap comprising, a substrate which carries a stack of at least two conductor layers in which a first conductor layer comprises a system of single spiral-like electric conductor tracks together constituting a multiple first spiral having an outer end and an inner end and a given sense of rotation and a plurality of connection conductors, a second conductor layer of the stack comprising a system of single spiral-like electric conductor tracks together constituting a second spiral having an inner end and an outer end and having the same sense of rotation as that of the first spiral, an electrically insulating layer interposed between adjacent conductor layers to separate them from each other, said insulating layer having windows therein for electrically interconnecting the adjacent conductor layers, the single conductor tracks of the second spiral being interrupted in places which are situated in a line, in which places the ends of the conductor tracks are interconnected on either side of the interruption via the windows in the electrically insulating layer and the connection conductors in the first conductor layer, means interconnecting the inner ends of the first and second spirals, and a conductor providing a lead out for the inner end of the second spiral so as to form a tap on the coil in which the conductor extends between the interruptions.

2. A multi-layer coil as claimed in claim 1 wherein the connection conductors are situated between the single conductor tracks in the first conductor layer.

3. A multi-layer coil as claimed in claim 1 or 2, characterized in that at least on the outside of the coil the perpendicular projections of the conductor tracks of the second conductor layer are situated on the first conductor layer between the conductor tracks of the first conductor layer.

4. A multi-layer coil as claimed in claim 3, characterized in that the intermediate space between successive conductor tracks of the first and of the second spiral increases proceeding from the inside of the coil to the outside.

5. An electric circuit as claimed in claim 4 wherein the conductor layer and the dielectric layer are provided in thick-film technology.

6. In a miniaturized electric circuit including a flat substrate which supports a coil having a centre tap, a capacitor and a set of crossing conductor paths and wherein the elements of the circuit are formed from a bottom conductor layer, a dielectric intermediate layer and a top conductor layer, the improvement comprising, a bottom conductor layer that comprises a system of single spiral-like conductor tracks together constituting a multiple first spiral having an outer end and an inner end and a given sense of rotation and a plurality of connection conductors, a top conductor layer that comprises a system of single spiral-like electric conductor tracks together constituting a second spiral having an inner end and an outer end and having the same sense of rotation as that of the first spiral, the dielectric intermediate layer having windows therein and being located between the top and bottom conductor layers to insulate same from one another, the conductor tracks of the second spiral being interrupted in places which are situated on one line, in which places the ends of the conductor tracks are interconnected on either side of the interruptions via the windows in the dielectric intermediate layer and the connection conductors in the bottom conductor layer, and in which the inner ends of the first and second spirals are interconnected and the inner end of the second spiral is led out to form a tap by means of a conductor path extending between the interruptions.

7. A flat multi-layer electric coil having a tap comprising, a first flat conductor layer having an uninterrupted first spiral electric conductor track having inner and outer ends and a plurality of strip conductors isolated from said spiral conductor track, an electric insulator layer having windows therein, a second flat conductor layer having a plurality of separate electric conductor tracks laid out in a generally spiral pattern with a non-spiral non-conductive path formed between the inside and the outside of the spiral pattern, said first and second conductor layers forming a sandwich arrangement with the insulator layer positioned in between to separate the conductor layers, means for interconnecting said plurality of separate electric conductor tracks via said windows and said strip conductors to form a second uninterrupted spiral electric conductor track having inner and outer ends and with the same winding sense as the first spiral conductor track, means interconnecting the inner ends of the first and second spiral conductor tracks, and an electric conductor path formed in the second conductor layer along said non-conductive path and connected to the inner end of the second spiral conductor track to form a tap for the electric coil.

8. An electric coil as claimed in claim 7 wherein said strip conductors are located so as to bridge said non-conductive path and are located in the spaces between adjacent turns of the first spiral conductor track.

9. An electric coil as claimed in claims 7 or 8 wherein the first and second spiral conductor tracks are located relative to one another so that predetermined turns of the second spiral conductor track are in alignment with the spaces between the turns of the first spiral conductor track in the first conductor layer.

10. An electric coil as claimed in claim 9 wherein the spaces between turns of at least one spiral conductor track are unequal.

* * * * *